US011201608B2

(12) United States Patent
Galan

(10) Patent No.: US 11,201,608 B2
(45) Date of Patent: Dec. 14, 2021

(54) SUPERCONDUCTING LATCH SYSTEM

(71) Applicant: Elias J. Galan, Baltimore, MD (US)

(72) Inventor: Elias J. Galan, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/857,325

(22) Filed: Apr. 24, 2020

(65) Prior Publication Data
US 2021/0336610 A1 Oct. 28, 2021

(51) Int. Cl.
| H03K 3/38 | (2006.01) |
| G01R 33/035 | (2006.01) |
| H01L 39/22 | (2006.01) |
| G06N 10/00 | (2019.01) |

(52) U.S. Cl.
CPC ........... *H03K 3/38* (2013.01); *G01R 33/0356* (2013.01); *G06N 10/00* (2019.01); *H01L 39/223* (2013.01)

(58) Field of Classification Search
CPC ...... H03K 3/38; G06N 10/00; G01R 33/0356; H01L 39/223
USPC ....................................................... 327/186
See application file for complete search history.

(56) References Cited

U.S. PATENT DOCUMENTS

| 4,360,898 A | 11/1982 | Faris |
| 5,250,859 A | 10/1993 | Kaplinsky |
| 5,323,344 A | 6/1994 | Katayama et al. |
| 6,104,764 A | 8/2000 | Ohta et al. |
| 6,420,895 B1 | 7/2002 | Herr et al. |
| 6,734,699 B1 | 5/2004 | Herr et al. |
| 6,781,435 B1 | 8/2004 | Gupta et al. |
| 7,724,020 B2 * | 5/2010 | Herr .................. H03K 19/1952 326/3 |
| 7,786,748 B1 | 8/2010 | Herr |
| 7,786,786 B2 | 8/2010 | Kirichenko |
| 7,975,195 B1 | 7/2011 | Joshi et al. |

(Continued)

FOREIGN PATENT DOCUMENTS

| CN | 101626233 A | 1/2010 |
| CN | 101626234 A | 1/2010 |

(Continued)

OTHER PUBLICATIONS

Non Final Office Action for U.S. Appl. No. 16/839,011 dated Oct. 14, 2020.

(Continued)

*Primary Examiner* — Metasebia T Retebo
(74) *Attorney, Agent, or Firm* — Tarolli, Sundheim, Covell & Tummino LLP

(57) ABSTRACT

One example includes a superconducting latch system. The system includes a first input stage configured to receive a first input pulse and a second input stage configured to receive a second input pulse. The system also includes a storage loop configured to switch from a first state to a second state in response to receiving the first input pulse, and to switch from the second state to the first state in response to the second input pulse. The first state corresponds to no flux in the storage loop and the second state corresponds to a flux in the storage loop. The system further includes an output stage configured to generate an output pulse in the second state of the storage loop.

20 Claims, 2 Drawing Sheets

(56) References Cited

U.S. PATENT DOCUMENTS

| | | |
|---|---|---|
| 7,975,795 B2 | 7/2011 | Asano |
| 7,991,814 B2 | 8/2011 | Filippov et al. |
| 8,022,722 B1 | 9/2011 | Pesetski et al. |
| 8,489,163 B2 | 7/2013 | Herr et al. |
| 8,571,614 B1 | 10/2013 | Mukhanov et al. |
| 9,355,364 B2 | 5/2016 | Miller et al. |
| 9,455,707 B2 | 9/2016 | Herr et al. |
| 9,473,124 B1 | 10/2016 | Mukhanov et al. |
| 9,543,959 B1 | 1/2017 | Carmean et al. |
| 9,595,969 B2 | 3/2017 | Miller et al. |
| 9,812,192 B1 | 11/2017 | Burnett et al. |
| 9,864,005 B1 | 1/2018 | Carmean et al. |
| 10,074,056 B2 | 9/2018 | Epstein |
| 10,084,454 B1 | 9/2018 | Braun et al. |
| 10,090,841 B1 | 10/2018 | Herr |
| 10,103,735 B1 | 10/2018 | Herr |
| 10,103,736 B1 | 10/2018 | Powell, III et al. |
| 10,147,484 B1 | 12/2018 | Braun |
| 10,158,348 B1 | 12/2018 | Braun |
| 10,158,363 B1 | 12/2018 | Braun |
| 10,171,087 B1 | 1/2019 | Braun |
| 10,311,369 B2 | 6/2019 | Epstein |
| 10,355,696 B1 | 7/2019 | Herr |
| 10,389,361 B1 | 8/2019 | Powell, III et al. |
| 10,547,314 B1 | 1/2020 | Braun |
| 10,554,207 B1 | 2/2020 | Herr et al. |
| 10,615,783 B2 | 4/2020 | Powell, III et al. |
| 10,650,319 B2 | 5/2020 | Medford |
| 11,010,686 B2 | 5/2021 | Medford |
| 2003/0011398 A1 | 1/2003 | Herr |
| 2003/0016069 A1 | 1/2003 | Furuta et al. |
| 2003/0055513 A1 | 3/2003 | Raussendorf et al. |
| 2004/0022332 A1 | 2/2004 | Gupta et al. |
| 2005/0224784 A1 | 10/2005 | Amin et al. |
| 2006/0290553 A1 | 12/2006 | Furuta et al. |
| 2007/0077906 A1 | 4/2007 | Kirichenko et al. |
| 2008/0186064 A1 | 8/2008 | Kirichenko |
| 2008/0231353 A1 | 9/2008 | Filippov et al. |
| 2009/0002014 A1* | 1/2009 | Gupta .................... H03K 19/01 326/3 |
| 2009/0153381 A1 | 6/2009 | Kirichenko |
| 2009/0289638 A1 | 11/2009 | Farinelli et al. |
| 2009/0319757 A1 | 12/2009 | Berkley |
| 2009/0322374 A1 | 12/2009 | Przybysz et al. |
| 2010/0033206 A1 | 2/2010 | Herr et al. |
| 2011/0267878 A1 | 11/2011 | Herr et al. |
| 2012/0184445 A1 | 7/2012 | Mukhanov et al. |
| 2013/0040818 A1 | 2/2013 | Herr et al. |
| 2014/0118024 A1 | 5/2014 | Eastin |
| 2014/0223224 A1 | 8/2014 | Berkley |
| 2015/0094207 A1 | 4/2015 | Herr et al. |
| 2015/0111754 A1 | 4/2015 | Harris et al. |
| 2015/0254571 A1 | 9/2015 | Miller et al. |
| 2015/0349780 A1 | 12/2015 | Naaman et al. |
| 2016/0034609 A1 | 2/2016 | Herr et al. |
| 2016/0125102 A1 | 5/2016 | Shauck et al. |
| 2017/0117901 A1 | 4/2017 | Carmean et al. |
| 2019/0149139 A1 | 5/2019 | Braun |
| 2020/0106444 A1 | 4/2020 | Herr et al. |
| 2021/0083676 A1 | 3/2021 | Herr et al. |

FOREIGN PATENT DOCUMENTS

| | | | |
|---|---|---|---|
| EP | 0061930 | A2 | 10/1982 |
| EP | 2430759 | B1 | 7/2015 |
| JP | S58135141 | A | 8/1983 |
| JP | S60163487 | A | 8/1985 |
| JP | H03167919 | A | 7/1991 |
| JP | H08148989 | A | 6/1996 |
| JP | 2000124794 | A | 4/2000 |
| JP | 2001504647 | A | 4/2001 |
| JP | 1996172352 | A | 11/2001 |
| JP | 2002344306 | A | 11/2002 |
| JP | 2006165812 | A | 6/2006 |
| JP | 2012064622 | A | 3/2012 |
| JP | 2012527158 | A | 11/2012 |
| JP | 2013529380 | A | 7/2013 |
| JP | 2014529216 | A | 10/2014 |
| WO | 2008/089067 | A1 | 7/2008 |
| WO | 2010132074 | A1 | 11/2010 |
| WO | 2012/174366 | A1 | 12/2012 |
| WO | 2013/025617 | A1 | 2/2013 |
| WO | 2014/028302 | A2 | 2/2014 |
| WO | 2016007136 | A1 | 1/2016 |
| WO | 2018075106 | A1 | 4/2018 |

OTHER PUBLICATIONS

Korean Office Action for Application No. 10-2018-7027661 dated Sep. 24, 2020.

Burm Baek, et al., "Hybrid superconducting-magnetic memory device using competing order parameters", Nature Communications, vol. 5, May 2014.

Australian Examination Report for Application No. 2018364954 dated Oct. 13, 2020.

Australian Examination Report for Application No. 2018364955 dated Oct. 21, 2020.

Canadian Office Action for Application No. 3032557 dated Nov. 5, 2020.

Canadian Office Action for Application No. 3032085 dated Nov. 9, 2020.

Barlett, S. D. et al., "A simple nearest-neighbor two-body Hamiltonian system for which the ground state is a universal resource for quantum computation", physical review a (Atomic, Molecular, and Optical), vol. 74, No. 4, p. 40302-1, DOI: 10.1103/Physreva.74.040302, Oct. 24, 2006.

Japanese Office Action for Application No. 2018-549958 dated Nov. 4, 2020.

Australian Examination Report for Application No. 2018634954 dated Dec. 2, 2020.

Japanese Office Action for JP Application No. 2019-505506 dated May 20, 2020.

Australian Examination Report for Application No. 2018321561 dated Jul. 29, 2020.

Okabe, et al., "Boolean Single Flux Quantum Circuits", IEICE Transactions on Electronics, Institute of Electronics, Tokyo, JP, vol. E84-C, No. 1, Jan. 1, 2001, pp. 9-14, XP001003211, ISSN: 0916-8524, Sections 3.2 and 3.4; figures 5, 11.

Grajcar et al, "Direct Josephson coupling between superconducting flux qubits", arxiv.org, Cornell University Library, 201 Olin Library Cornell University Ithaca, NY 14853, Jan. 5, 2005, XP080187009, DOI: 10.1103/PHYSERVB.72.020503, figure 5.

Bacon et al., "Adiabatic Gate Teleportation", arxiv.org, Cornell University Library, 201 Olin Library Cornell University Ithaca, NY 14853 (May 6, 2009), doi: 10.1103/PHYSERVLETT.103.120504, Claims 1-20.

Li, et al.-2, "Dynamical Autler-Townes control of a phase qubit", Scientific Reports, vol. 2, Dec. 11, 2012, XP055268241, DOI: 10.1038/srep00654 *p. 1-p. 6, right-hand column, paragraph 2*.

Jerger, et al., "Frequecy division multiplexing readout and simultaneous manipulation of an array of flux quibts", Applied Physics Letters, AIP Publicsing LLC, US, vol. 101, No. 4, Jul. 23, 2012, p. 42604-42604, XP012164086, ISSN: 0003-6951, DOI: 10.1063/1.4739454 [retrieved on Jul. 27, 2012] *p. 042604-1-p. 042604-3*.

Li, et al., "Operation of a phase qubit as a quantum switch", arxiv.org, Cornell University Library, 201 Olin Library Cornell University Ithaca, NY 14853, Mar. 14, 2011, SP080543914, DOI: 10.1038/SREP00645 *p. 1-p. 3, right-hand column, paragraph 3*.

Dicarlo et al., "Demonstration of Two-Qubit Algorithms with a Superconducting Quantum Porcessor", arxiv.org, Cornell University Library, 201 Olin Library Cornell University Ithaca, NY 14853, Mar. 11, 2009, XP080314862, DOI: 10.1038/NATURE08121 *the whole document*.

Laucht, et al., "electrically controlling single-spin qubits in a continuous microwave field", Science, vol. 1, No. 3 Apr. 10, 2015, pp. e150002-e1500022, XP055267170, US ISSN: 0036-8075, DOI: 10.14126/sciadv.1500022 *the whole document*.

(56) References Cited

OTHER PUBLICATIONS

Warren: "Gates for Adiabatic Quantum Computing", Aug. 26, 2014 (Aug. 26, 2014), XP055438870.
Rabi frequency https://en.wikipedia.org/wiki/Rabi_frequency (Year: NA).
The formula for the dot product in terms of vector components https://mathinsight.org/dot_product_formula_components (Year: NA).
Nowka, "High-Performance CMOS system Design Using Wave Pipelining", Sematantic Scholar, https://www.semanticscolar.org/paper/High-Performance-CMOS-System-Design-Using-Wave-Nowka/a5ef4cd1e69cae058f162a9a8bf085b027d35f0c, Jan. 31, 1996 (Jan. 31, 1996).
Japanese Office Action for Application No. 2020-518711 dated Mar. 16, 2021.
Japanese Office Action for Application No. 2020-518629 dated Mar. 16, 2021.
Japanese Office Action for Application No. 2020-517893 dated Feb. 16, 2021.
Japanese Office Action for Application No. 2020-517892 dated Feb. 16, 2021.
Korean Office Action for Application No. 10-2020-7012934 dated Feb. 23, 2021.
Canadian Office Action for Application No. 3072186 dated Mar. 29, 2021.
Fourie CJ et al: "A Single-Clock Asynchronous Input COSL Set-Reset Flip-Flop and SFQ to Voltage State Interface", IEEE Transactions on Applied Superconductivity, IEEE Service Center, Los Alamitos, CA, US, vol. 15, No. 2, Jun. 1, 2005 (Jun. 1, 2005), pp. 263-266, XP011133767, ISSN: 1051-8223, DOI: 10.1109/T ASC.2005.849785.
International Search Report for Application No. PCT/US2021/023742 dated Jul. 7, 2021.

\* cited by examiner

SUPERCONDUCTING LATCH SYSTEM

GOVERNMENT INTEREST

This invention was made with U.S. Government support. The U.S. Government has certain rights in this invention.

TECHNICAL FIELD

This disclosure relates generally to classical superconducting computing systems, and more specifically to a superconducting latch system.

BACKGROUND

Superconducting digital technology has provided computing and/or communications resources that benefit from unprecedented high speed, low power dissipation, and low operating temperature. Superconducting computer systems typically implement very low amplitude voltage pulses (e.g., quantized flux pulses), such as single flux quantum (SFQ) pulses or reciprocal quantum logic (RQL) pulses to communicate data. Such very low amplitude voltage pulses are implemented for substantially all logic functions and/or communication of data between different logic gates and/or different portions of a given computer system. Substantially all computing systems require logic gates and latches to process data and perform a variety of logic functions.

SUMMARY

One example includes a superconducting latch system. The system includes a first input stage configured to receive a first input pulse and a second input stage configured to receive a second input pulse. The system also includes a storage loop configured to switch from a first state to a second state in response to receiving the first input pulse, and to switch from the second state to the first state in response to the second input pulse. The first state corresponds to no flux in the storage loop and the second state corresponds to a flux in the storage loop. The system further includes an output stage configured to generate an output pulse in the second state of the storage loop.

Another example includes a method for controlling a superconducting latch system. The method includes providing a first input pulse to a first input stage of the superconducting latch system to switch a storage loop of the superconducting latch system from a first state to a second state. The first state corresponds to no flux in the storage loop and the second state corresponds to a flux in the storage loop. The method also includes providing a second input pulse to a second input stage of the superconducting latch system to switch the storage loop from the second first state to the second state. The method further includes providing a clock signal to an output stage of the superconducting latch system to generate an output pulse from the output stage at each cycle of the clock signal in the second state of the storage loop.

Another example includes a superconducting latch system. The system also includes a first input stage configured to receive a first reciprocal quantum logic (RQL) pulse and a second input stage configured to receive a second RQL pulse. The system also includes a superconducting quantum interference device (SQUID) configured to switch from a first state to a second state in response to receiving the first RQL pulse, and to switch from the second state to the first state in response to the second RQL pulse. The first state corresponds to no flux in the SQUID and the second state corresponds to a flux in the SQUID. The system further includes an output stage configured to generate an output pulse at each cycle of an RQL clock signal in the second state of the SQUID.

DETAILED DESCRIPTION

This disclosure relates generally to classical superconducting computing systems, and more specifically to a superconducting latch system. As an example, the superconducting latch system can be configured as a set/reset (SR) latch. For example, the superconducting latch system includes a first input stage that is configured to receive a first input pulse and a second input stage that is configured to receive a second input pulse. As an example, the first input stage can correspond to a set input stage and the second input stage can correspond to a reset input stage. As another example, the first and second input pulses can each be provided as reciprocal quantum logic (RQL) pulses. As described herein, RQL pulses are defined as a complementary pair of a positive fluxon and a negative fluxon. Therefore, the first input pulse can be provided to the first input stage to "set" the superconducting latch system, thus providing an output pulse at an output stage of the superconducting latch system. For example, the output stage can be provided a clock signal (e.g., an RQL clock signal) to provide the output pulse or a continuous phase output at each cycle of the clock signal while the superconducting latch system is "set". The second input pulse can thus be provided to the second input stage to "reset" the superconducting latch system, thus stopping any output pulses from being provided from the output stage.

As an example, the superconducting latch system can include a storage loop that is configured to hysteretically store the state of the superconducting latch system. The storage loop can be configured as a superconducting quantum interference device (SQUID) that is configured to store a flux in one state and no flux in another. For example, the storage loop can store the flux in response to the first input stage receiving the first input pulse. Therefore, the output stage can provide the output pulse while the storage loop stores the flux, such as based on the clock signal (e.g., at each cycle of the clock signal). Similarly, the storage loop can be reset to store no flux in response to the second input stage receiving the second input pulse. Additionally, the first input stage can receive a DC bias current, such as inductively via a transformer. The DC bias current can be provided to the second input stage via an inductor to reject the second input pulse when the storage loop stores no flux, thus providing no effect with respect to a subsequent reset signal while the storage loop is in a "reset" (e.g., zero flux) state.

Figure 1:
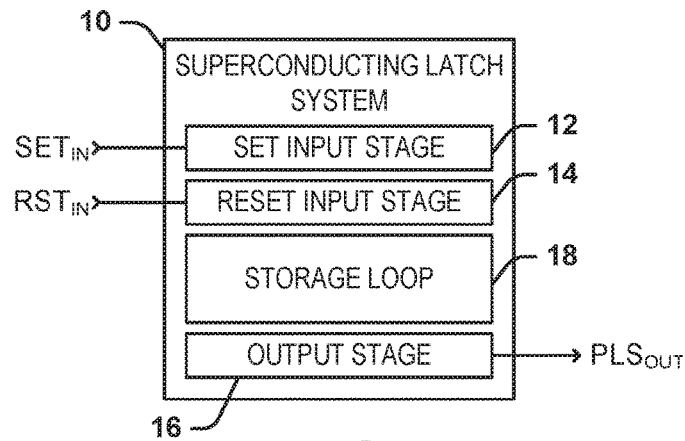
FIG. 1 illustrates an example of a superconducting latch system.

FIG. 1 illustrates an example of a superconducting latch system 10. The superconducting latch system 10 can be implemented in any of a variety of classical computing systems to provide a data latching function. As an example, the superconducting latch system 10 can be configured as a set/reset (SR) latch.

In the example of FIG. 1, the superconducting latch system 10 includes a set input stage 12 that can correspond to a set input (e.g., "S" input) and a reset input stage 14 that can correspond to a reset input (e.g., "R" input). The set input stage 12 can receive a first input pulse, demonstrated in the example of FIG. 1 as a signal $SET_{IN}$, and the reset input stage 14 can receive a second input pulse, demonstrated in the example of FIG. 1 as a signal $RST_{IN}$. Therefore, the superconducting latch system 10 can be "set" in response to the first input pulse $SET_{IN}$ to switch the superconducting latch system 10 to a first state (e.g., a "set" state) to provide an output pulse, demonstrated in the example of FIG. 1 as a signal $PLS_{OUT}$, from an output stage 16. Similarly, the superconducting latch system 10 can be "reset" in response to the second input pulse $RST_{IN}$, to switch the superconducting latch system 10 to a second state (e.g., a "reset" or "zero" state) to provide no output pulse $PLS_{OUT}$ from the output stage 16.

The superconducting latch system 10 also includes a storage loop 18 that is configured to hysteretically store the state of the superconducting latch system 10. As an example, the storage loop 18 can be configured as a superconducting quantum interference device (SQUID) that is configured to store a flux in the "set" state, and to store no flux in the "reset" state. For example, the storage loop 18 can store the flux in response to the set input stage 12 receiving the first input pulse $SET_{IN}$, such as in response to triggering a pair of Josephson junctions associated with the corresponding SQUID. Therefore, the output stage 16 can provide the output pulse $PLS_{OUT}$ while the storage loop 18 stores the flux. For example, the output stage 16 can provide the output pulse $PLS_{OUT}$ at each cycle of a clock signal. Similarly, the storage loop 18 can be reset to store no flux in response to the reset input stage 14 receiving the second input pulse $RST_{IN}$. Therefore, the output stage 16 can cease to provide the output pulse $PLS_{OUT}$ (e.g., at each cycle of an associated clock signal).

Therefore, the superconducting latch system 10 can operate as an SR latch. For example, the first input pulse $SET_{IN}$ can be provided as a logic-1 to the set input stage 12 to "set" the superconducting latch system 10 by storing the flux in the storage loop 18. Thus, the superconducting latch system 10 can provide the output pulse $PLS_{OUT}$ corresponding to a logic-1 output. Similarly, the second input pulse $RST_{IN}$ can be provided as a logic-1 to the reset input stage 14 to "reset" the superconducting latch system 10 by removing the flux from the storage loop 18. Thus, the superconducting latch system 10 can cease to provide the output pulse $PLS_{OUT}$, which therefore corresponds to a logic-0 output.

Figure 2:
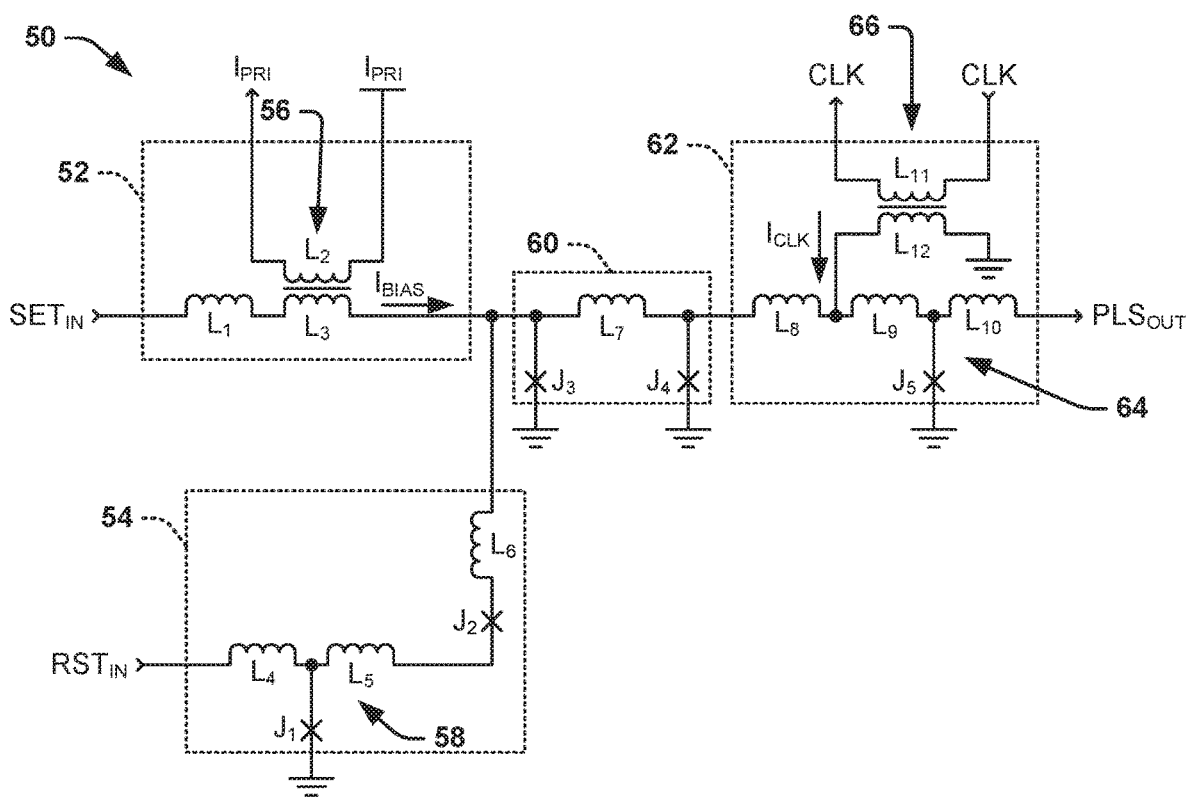
FIG. 2 illustrates an example of a superconducting latch circuit.

FIG. 2 illustrates an example of a superconducting latch circuit 50. The superconducting latch circuit 50 can be implemented in any of a variety of classical computing systems to provide a data latching function. As an example, the superconducting latch circuit 50 can be configured as an SR latch. For example, the superconducting latch circuit 50 can correspond to the superconducting latch system 10 in the example of FIG. 1.

In the example of FIG. 2, the superconducting latch circuit 50 includes a set input stage 52 that can correspond to a set input (e.g., "S" input) and a reset input stage 54 that can correspond to a reset input (e.g., "R" input). The set input stage 52 includes an inductor $L_1$ and a transformer 56. The transformer 56 includes a primary winding $L_2$ and a secondary winding $L_3$ that is arranged in series with the inductor $L_1$. The primary winding $L_2$ is coupled to a DC current source $I_{PRI}$, such as interconnecting the DC current source $I_{PRI}$ and a low-voltage rail (e.g., ground), such that the primary winding $L_2$ can induce a DC bias current $I_{BIAS}$ in the secondary winding $L_3$. The reset input stage 54 includes an inductor $L_4$ and an inductor $L_5$ that are each coupled to a Josephson junction $J_1$. The inductors $L_4$ and $L_5$ and the Josephson junction $J_1$ collectively form a Josephson transmission line (JTL) stage 58. The reset input stage 54 also includes a Josephson junction $J_2$ and an inductor $L_6$ that are arranged in series with each other and with the JTL stage 58. As an example, the Josephson junction $J_2$ can be an unshunted Josephson junction.

The superconducting latch circuit 50 also includes a storage loop 60 that is coupled to each of the set input stage 52 and the reset input stage 54. In the example of FIG. 2, the storage loop 60 is configured as a SQUID that includes a Josephson junction $J_3$, an inductor $L_7$, and a Josephson junction $J_4$. Additionally, the superconducting latch circuit 50 includes an output stage 62 that is coupled to the storage loop 60. The output stage 62 includes an inductor $L_8$, an inductor $L_9$, an inductor $L_{10}$, and a Josephson junction $J_5$ interconnecting the inductors $L_9$ and $L_{10}$. Therefore, the inductors $L_9$ and $L_{10}$ and the Josephson junction $J_5$ form a JTL stage 64 at the output of the superconducting latch circuit 50. The output stage 62 also includes a transformer 66 that includes a primary winding $L_{11}$ and a secondary winding $L_{12}$ that is coupled to the inductors $L_8$ and $L_9$. The primary winding $L_{11}$ conducts a clock signal CLK, such that the primary winding $L_{11}$ can induce a clock current $I_{CLK}$ in the secondary winding $L_{12}$.

The set input stage 52 can receive a first input pulse $SET_{IN}$, and the reset input stage 54 can receive a second input pulse $RST_{IN}$. Therefore, similar to the superconducting latch system 10 described in the example of FIG. 1, the superconducting latch circuit 50 can be "set" in response to the first input pulse $SET_{IN}$ to switch the superconducting latch circuit 50 to a first state (e.g., a "set" state) to provide the output pulse $PLS_{OUT}$ via the output stage 62. For example, the DC bias current $I_{BIAS}$ is configured to bias the Josephson junctions $J_2$, $J_3$, and $J_4$. Therefore, in response to the first input pulse $SET_{IN}$, the Josephson junctions $J_2$, $J_3$, and $J_4$ each trigger. The triggering of the Josephson junctions $J_3$ and $J_4$ can store a flux $\Phi_0$ corresponding to a single flux quantum (SFQ) in the storage loop 60. While the flux $\Phi_0$ is stored in the storage loop 60, subsequent first input pulses $SET_{IN}$ do not change the state of the storage loop 60 because the storage loop 60 maintains the stored flux $\Phi_0$. As a result, in response to the clock current $I_{CLK}$ being provided to the JTL stage 64 in the output stage 62, the Josephson junction $J_5$ can trigger to provide the output pulse $PLS_{OUT}$ based on the combination of the clock current Tax and the flux $\Phi_0$. For example, the Josephson junction $J_5$ can trigger at each cycle of the clock signal CLK based on the induced clock current $I_{CLK}$ and the flux $\Phi_0$ while the flux $\Phi_0$ is stored in the storage loop 60.

As another example, while the flux $\Phi_0$ is stored in the storage loop 60, in response to the second input pulse $RST_{IN}$, the second input pulse $RST_{IN}$ triggers the Josephson junction $J_1$. The triggering of the Josephson junction $J_1$ untriggers (e.g., resets) the Josephson junction $J_2$, which thus untriggers the Josephson junctions $J_3$ and $J_4$. As a result, the flux $\Phi_0$ is removed from the storage loop 60 to reset the storage loop 60 (e.g., setting to a zero state), and thus the superconducting latch circuit 50. Without the flux $\Phi_0$ stored in the storage loop 60, subsequent second input pulses $RST_{IN}$ do not change the state of the storage loop 60 because the DC bias current $I_{BIAS}$ increases the threshold current of the Josephson junction $J_2$, thus preventing the Josephson junction $J_2$ from triggering in response to the second input pulse RST$_{IN}$. Therefore, the DC bias current I$_{BIAS}$ rejects subsequent second input pulses RST$_{IN}$ absent the flux $\Phi_0$ in the storage loop 60. As a result, in response to the clock current I$_{CLK}$ being provided to the JTL stage 64 in the output stage 62, the Josephson junction J$_5$ does not trigger, and thus does not provide the output pulse PLS$_{OUT}$, absent the flux $\Phi_0$.

As an example, the superconducting latch circuit 50 can be implemented in a reciprocal quantum logic (RQL) computing system. For example, each of the first and second input pulses SET$_{IN}$ and RST$_{IN}$ can be provided as RQL pulses, such as including a positive fluxon followed by a negative fluxon. In addition, the clock signal CLK can be implemented as an RQL clock signal, such as including at least one of an in-phase component and a quadrature-phase component. With respect to the first input pulse SET$_{IN}$, the positive fluxon of the first input pulse SET$_{IN}$ can trigger the Josephson junctions J$_2$, J$_3$, and J$_4$, as described previously. However, the DC bias current I$_{BIAS}$ can reject the negative fluxon. Similarly, the DC bias current I$_{BIAS}$ can reject the negative fluxon associated with the second input pulse RST$_{IN}$ subsequent to untriggering the Josephson junction J$_2$. Accordingly, the superconducting latch circuit 50 can operate as described, even in an RQL environment.

The superconducting latch circuit 50 can thus provide SR latching capability for a combination classical computing system. Previous latching in a superconducting environment has typically been implemented by variations of the D flip-flop, which has a different set of logic for operation and manipulation of data. Additionally, typical variations of SR latches can implement feedback that can provide for timing errors. However, the superconducting latch circuit 50 has no feedback, and can thus implement timing control effectively, particularly in an RQL environment based on the timing control of an RQL clock. Additionally, other types of SR latches typically required large transformers and supportive JTL systems and circuitry that occupy significant amounts of space and can incur additional fabrication costs. However, the superconducting latch circuit 50 significantly mitigates the number of transformers and JTL circuits in the design to reduce both fabrication cost and an overall circuit footprint.

Figure 3:
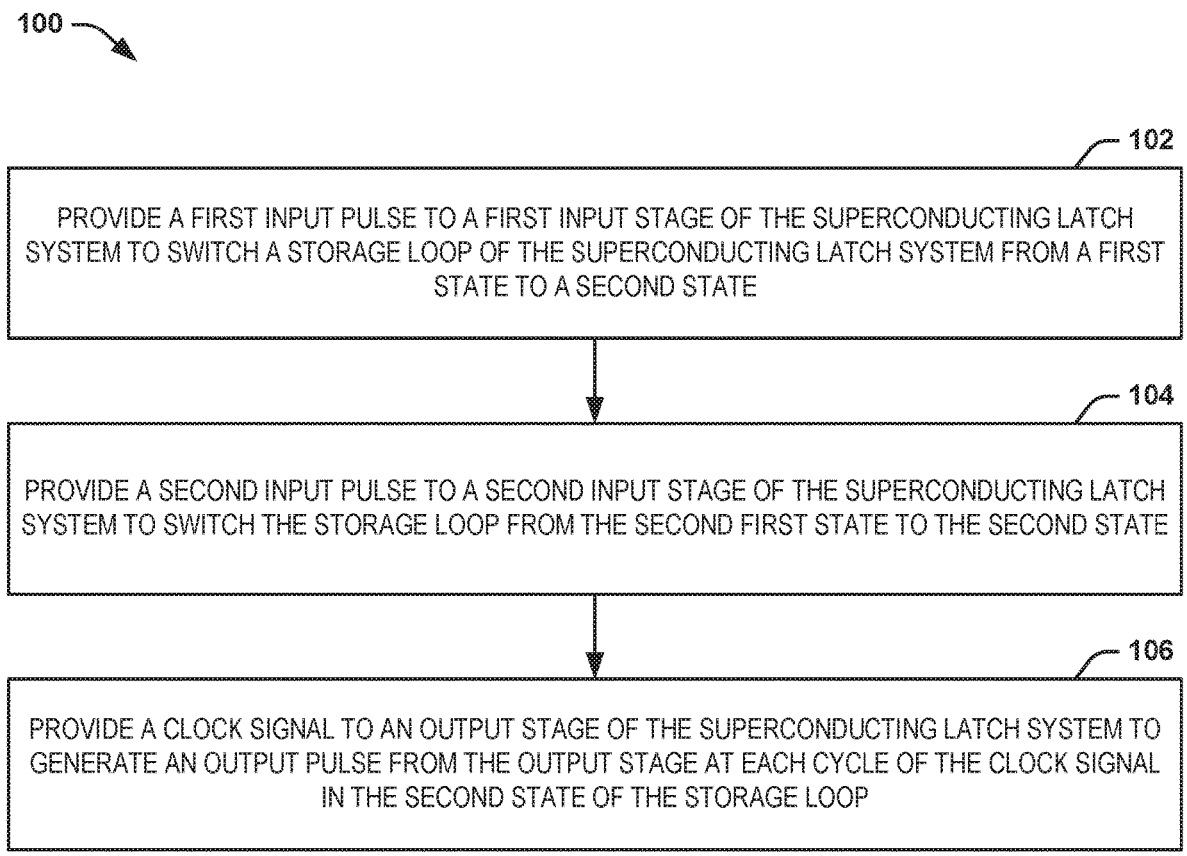
FIG. 3 illustrates an example of a method for controlling a superconducting latch system.

In view of the foregoing structural and functional features described above, a methodology in accordance with various aspects of the present invention will be better appreciated with reference to FIG. 3. While, for purposes of simplicity of explanation, the methodology of FIG. 3 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 3 illustrates an example of a method 100 for controlling a superconducting latch system (e.g., the superconducting latch system 10). At 102, a first input pulse (e.g., the first input pulse SET$_{IN}$) is provided to a first input stage (e.g., the set input stage 12) of the superconducting latch system to switch a storage loop (e.g., the storage loop 18) of the superconducting latch system from a first state to a second state. At 104, a second input pulse (e.g., the second input pulse RST$_{IN}$) is provided to a second input stage (e.g., the reset input stage 14) of the superconducting latch system to switch the storage loop from the second first state to the second state. At 106, a clock signal (e.g., the clock signal CLK) is provided to an output stage (e.g., the output stage 16) of the superconducting latch system to generate an output pulse (e.g., the output pulse PLS$_{OUT}$) from the output stage at each cycle of the clock signal in the second state of the storage loop.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A superconducting latch system comprising:
   a first input stage configured to receive a first input pulse and a bias current;
   a second input stage configured to receive a second input pulse;
   a storage loop configured to switch from a first state to a second state in response to receiving the first input pulse, and to switch from the second state to the first state in response to receiving the second input pulse, where the first state corresponds to no flux in the storage loop and the second state corresponds to a flux in the storage loop, and the second input stage is configured to receive the bias current when the storage loop is in the first state to prevent the storage loop from switching from the first state to the second state in response to receiving a third input pulse at the second input stage; and
   an output stage configured to generate an output pulse in the second state of the storage loop.

2. The system of claim 1, wherein the superconducting latch system is arranged as a set/reset (SR) latch, such that the first input stage is configured as a set input stage and the second input stage is configured as a reset input stage.

3. The system of claim 1, wherein the output stage is configured to receive a clock signal, wherein the output stage is configured to provide the output pulse at each cycle of the clock signal in the second state of the storage loop.

4. The system of claim 3, wherein the first input pulse is a first reciprocal quantum logic (RQL) input pulse, wherein the second input pulse is a second RQL input pulse, wherein the clock signal is an RQL clock signal.

5. The system of claim 3, wherein the output stage is arranged as a Josephson transmission line (JTL) stage, wherein the clock signal is inductively coupled to the JTL stage.

6. The system of claim 5, wherein the clock signal is configured to bias a Josephson junction associated with the JTL stage of the output stage at each cycle of the clock signal, such that the Josephson junction is configured to trigger at each cycle of the clock signal in the second state of the storage loop.

7. The system of claim 1, wherein the first input pulse is a first reciprocal quantum logic (RQL) input pulse and the input current is a direct current (DC) bias current, wherein the first input stage is configured to receive the DC bias current to reject a negative fluxon associated with the first RQL pulse.

8. The system of claim 7, wherein the first input stage comprises a transformer configured to inductively provide the DC bias current to the storage loop and to the second input stage, wherein the second input stage is configured to reject the third input pulse received at the second input stage in the first state of the storage loop.

9. The system of claim 1, wherein the second input stage comprises:
   a Josephson transmission line (JTL) stage configured to receive the second input pulse;
   a Josephson junction that is biased by a direct current (DC) bias current corresponding to the bias current, the Josephson junction being triggered in response to the first input pulse and being reset in response to the second input pulse; and
   an inductor interconnecting the Josephson junction and the storage loop, wherein the inductor propagates the DC bias current to reject the third input pulse received at the second input stage in the first state of the storage loop.

10. The system of claim 1, wherein the storage loop is configured as a superconducting quantum interference device (SQUID).

11. A method for controlling a superconducting latch system, the method comprising:
   providing a first input pulse to a first input stage of the superconducting latch system to switch a storage loop of the superconducting latch system from a first state to a second state, where the first state corresponds to no flux in the storage loop and the second state corresponds to a flux in the storage loop;
   providing a second input pulse to a second input stage of the superconducting latch system to switch the storage loop from the second first state to the first second state;
   providing a clock signal to an output stage of the superconducting latch system to generate an output pulse from the output stage at each cycle of the clock signal in the second state of the storage loop; and
   providing a bias current from the first input stage to the second input stage to reject a third input pulse received at the second input stage when the storage loop is in the first state to prevent the storage loop from switching from the first state to the second state.

12. The method of claim 11, wherein providing the first input pulse comprises providing a first reciprocal quantum logic (RQL) input pulse, wherein providing the second input pulse comprises providing a second RQL input pulse, wherein the clock signal is an RQL clock signal.

13. The method of claim 11, wherein the bias current is a direct current (DC) bias current, the method further comprising providing the DC bias current to reject a negative fluxon associated with the first RQL pulse.

14. The method of claim 13, wherein providing the DC bias current comprises inductively providing the DC bias current to the storage loop and to the second input stage via a transformer, wherein the DC bias current is further configured to reject the third input pulse received at the second input stage in the first state of the storage loop.

15. The method of claim 11, wherein the output stage is arranged as a Josephson transmission line (JTL) stage, wherein the clock signal is inductively coupled to the JTL stage.

16. The method of claim 15, wherein providing the clock signal comprises biasing a Josephson junction associated with the JTL stage of the output stage at each cycle of the clock signal, such that the Josephson junction is configured to trigger at each cycle of the clock signal in the second state of the storage loop.

17. A superconducting latch system comprising:
   a first input stage configured to receive a first reciprocal quantum logic (RQL) pulse and a bias current;
   a second input stage configured to receive a second RQL pulse;
   a superconducting quantum interference device (SQUID) configured to switch from a first state to a second state in response to receiving the first RQL pulse, and to switch from the second state to the first state in response to receiving the second RQL pulse, where the first state corresponds to no flux in the SQUID and the second state corresponds to a flux in the SQUID and the second input stage is configured to receive the bias current when the SQUID is in the first state to prevent the SQUID from switching from the first state to the second state in response to a third input pulse received at the second input stage; and
   an output stage configured to generate an output pulse based on an RQL clock signal in the second state of the SQUID, and to generate no output pulse in the first state of the SQUID.

18. The system of claim 17, wherein the output stage is arranged as a Josephson transmission line (JTL) stage, wherein the RQL clock signal is inductively coupled to the JTL stage to bias a Josephson junction associated with the JTL stage of the output stage at each cycle of the RQL clock signal, such that the Josephson junction is configured to trigger at each cycle of the RQL clock signal in the second state of the SQUID.

19. The system of claim 17, wherein the first input stage comprises a transformer configured to inductively provide a direct current (DC) bias current corresponding to the bias current to the SQUID and to the second input stage, wherein the DC bias current is further configured to reject a negative fluxon associated with the first RQL pulse and to reject a third RQL pulse received at the second input stage in the first state of the SQUID.

20. The system of claim 17, wherein the second input stage comprises:
   a Josephson transmission line (JTL) stage configured to receive the second RQL pulse;
   a Josephson junction that is biased by a direct current (DC) bias current corresponding to the bias current, the Josephson junction being triggered in response to the first RQL pulse and being reset in response to the second RQL pulse; and
   an inductor interconnecting the Josephson junction and the SQUID, wherein the inductor propagates the DC bias current to reject a third RQL pulse received at the second input stage in the first state of the SQUID.

* * * * *